US006664855B2

(12) United States Patent
Buer et al.

(10) Patent No.: US 6,664,855 B2
(45) Date of Patent: Dec. 16, 2003

(54) MMIC DRIVER AMPLIFIER HAVING ZIG-ZAG RF SIGNAL FLOW

(75) Inventors: Kenneth V. Buer, Gilbert, AZ (US); Deborah S. Dendy, Tempe, AZ (US)

(73) Assignee: U.S. Monolithics, L.L.C., Chandler, AZ (US)

(*) Notice: Subject to any disclaimer, the term of this patent is extended or adjusted under 35 U.S.C. 154(b) by 0 days.

(21) Appl. No.: 10/118,277

(22) Filed: Apr. 8, 2002

(65) Prior Publication Data

US 2002/0180530 A1 Dec. 5, 2002

Related U.S. Application Data

(60) Provisional application No. 60/295,628, filed on Jun. 4, 2001.

(51) Int. Cl.[7] .............................. H03F 3/60; H03F 3/16; H03F 3/14; H03F 3/04
(52) U.S. Cl. ...................... 330/286; 330/277; 330/307; 330/311
(58) Field of Search ................................ 330/286, 277, 330/307, 311

(56) References Cited

U.S. PATENT DOCUMENTS

| | | | | |
|---|---|---|---|---|
| 4,429,416 A | * | 1/1984 | Page | 455/211 |
| 4,843,344 A | * | 6/1989 | Cox | 330/264 |
| 4,897,617 A | * | 1/1990 | Milberger et al. | 330/277 |
| 5,008,633 A | | 4/1991 | Hom | |
| 5,465,070 A | * | 11/1995 | Koyama et al. | 327/350 |
| 5,952,886 A | | 9/1999 | Buer et al. | |
| 5,983,089 A | | 11/1999 | Mohwinkel et al. | |
| 6,362,689 B1 | * | 3/2002 | Buer | 330/295 |

* cited by examiner

Primary Examiner—Patricia Nguyen
(74) Attorney, Agent, or Firm—Snell & Wilmer, L.L.P.

(57) ABSTRACT

A MMIC (microwave monolithic integrated circuit) driver amplifier having a zig-zag RF signal flow and method for the same is provided. A smaller die size and higher output gain are realized with the improved amplification stage geometry provided herein. In particular, the stages are configured in a "stacked" topology permitting a zig-zag RF signal flow through the stages. Additionally, the DC bias circuitry may be is centralized and adjacent stages may share vias. The die area for a typical K-band driver amplifier may be reduced by about 56% over a conventional amplifier design.

20 Claims, 3 Drawing Sheets

MMIC DRIVER AMPLIFIER HAVING ZIG-ZAG RF SIGNAL FLOW

CROSS REFERENCE TO RELATED APPLICATIONS

This application includes subject matter that is related to and claims priority from U.S. Provisional Patent Application Ser. No. 60/295,628, filed Jun. 4, 2001, under the same title, hereby incorporated by reference.

FIELD OF INVENTION

The invention relates generally to a system and method for RF signal amplification and, in particular, to a MMIC driver amplifier. More particularly, the invention relates to a system and method for a MMIC driver amplifier having a zig-zag RF signal flow.

BACKGROUND OF THE INVENTION

Monolithic microwave integrated circuit (MMIC) amplifiers are typically used to amplify high frequency RF and/or microwave signals. Increasing the RF gain (or amplification) in amplifiers, such as MMIC driver amplifiers, typically requires increasing the number of amplification stages, which is accomplished by increasing the number of transistors. Unfortunately, there is generally a sharp correlation between increasing the amplification and the design cost. This is due largely in part because as the amplification increases, the space needed on the die for amplification also increases and therefore the size of the die must also increase. Thus, it would be desirable to increase the signal amplification in a driver amplifier without causing an increase in the size of the die.

Accordingly, there exists a need for a driver amplifier with a reduced die size. In addition, there is a need for a low cost driver amplifier. Further, there is a need for improved performance driver amplifiers having higher gain and increased efficiency.

SUMMARY OF THE INVENTION

A system and method for driver amplification is providing having a plurality of amplification stages arranged on a die to permit an RF signal flow from one stage to the next. The signal flow being characteristic of a zig-zag pattern. Additionally, the driver amplifier having a DC bias circuitry centralized on the die and providing a bias feed to each of the stages.

In another embodiment, a driver amplifier of the invention includes amplification stages being arranged in a stacked configuration such that adjacent stages are orientated in opposite directions.

In yet another embodiment, a driver amplifier of the invention includes an interstage matching network comprising a DC bias feed from the DC bias circuitry and a DC blocking capacitor.

In still another embodiment, a driver amplifier of the invention includes sharing source vias between at least two of the stages.

A method of manufacturing a driver amplifier includes arranging a plurality of amplification stages on a die such that an RF signal flows through the stages in a substantially zig-zag pattern. Additionally, DC bias circuitry is arranged on a perimeter of the die and transmission lines are routed between the DC bias circuitry and each of the stages. The transmission lines may be modified to provide signal matching between the stages.

BRIEF DESCRIPTION OF THE DRAWINGS

These and other features, aspects and advantages of the present invention will become better understood with reference to the following description, appending claims, and accompanying drawings where:

DETAILED DESCRIPTION

The invention provides a MMIC driver amplifier system and method having an improved amplifier stage geometry and signal flow. In particular, the invention provides a MMIC driver amplifier with a reduced die size, an increased gain and a reduced number of components. More particularly, a MMIC driver amplifier system and method of the invention provides a compact die size by, for example, configuring the amplification stages to permit a zig-zag RF signal flow, centralizing the bias circuitry, eliminating additional components for interstage matching, and possibly providing shared vias between stages.

The subject matter of the invention is particularly suited for use in connection with K band driver and medium power amplifiers. Reference may also be made to a FET (field effect transistor) driver amplifier; however, it should be appreciated and understood by one skilled in the art that various other transistors such as bipolar junction transistors (BJTs) and heterojunction bipolar transistors (HBTs), and other frequencies may appropriately be used in the invention. The following descriptions are not intended as a limitation on the use or applicability of the invention, but instead are provided merely to enable a full and complete description of a preferred embodiment.

Figure 1:
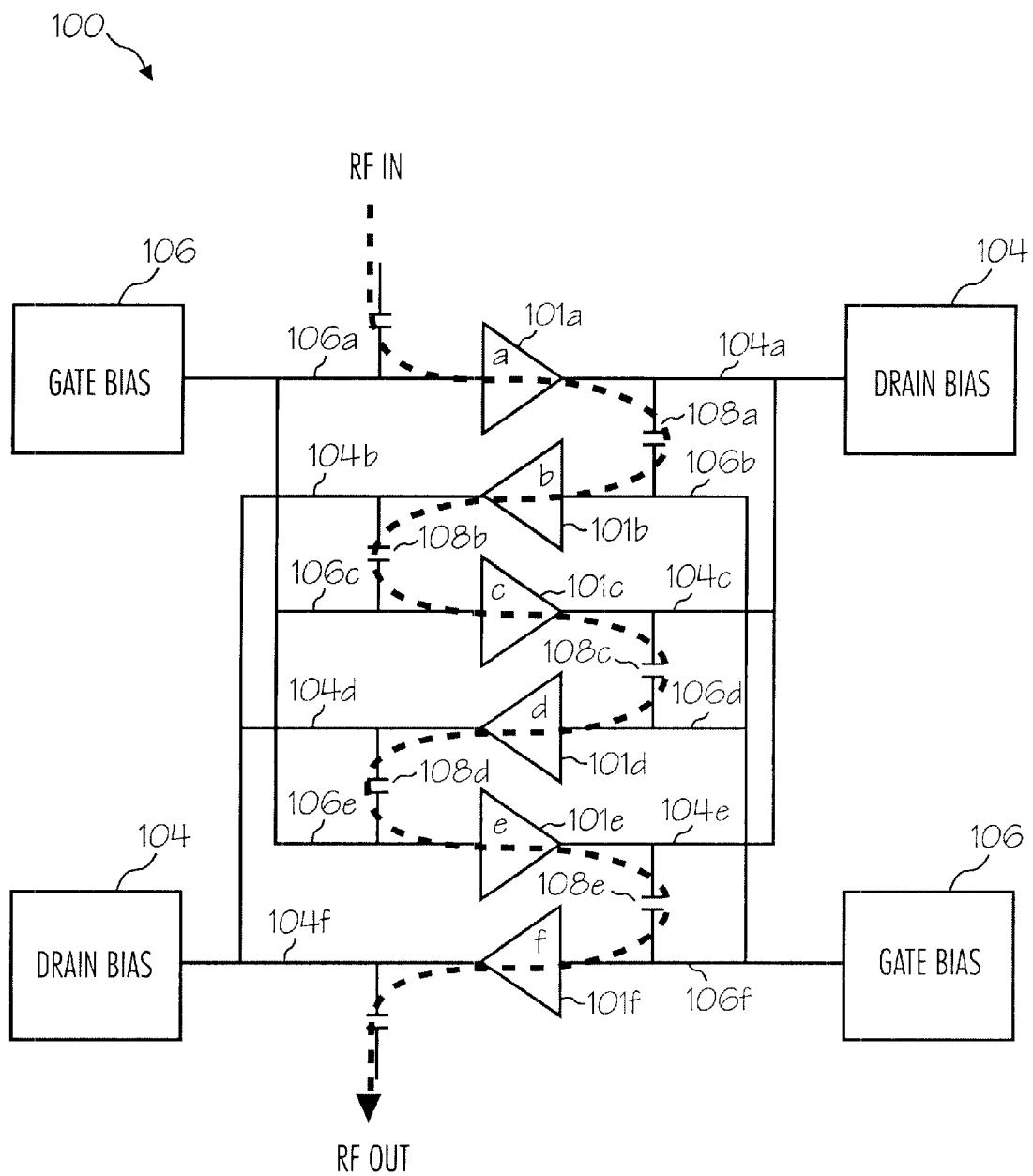
FIG. 1 illustrates, in block format, a MMIC driver amplifier in accordance with one embodiment of the invention.

FIG. 1 illustrates, in block format, an exemplary layout of a MMIC driver amplifier 100 in accordance with one embodiment of the invention. MMIC driver amplifier 100 includes six stages of amplification 101a–101f which may include FETs, HBTs, or any other suitable active device for the frequency of operation (the active devices are not shown in the present Figure). It should be appreciated that the number of stages, as well as the number of FETs making up each stage can vary depending upon the power drive needed for a particular application.

The unique zig-zag signal flow through the amplification stages of amplifier 100 is represented on FIG. 1 with a dashed line. Although not explicitly identified in the Figure, each amplification stage of amplifier 100 includes a suitable RF signal input and output. In operation, a RF signal is supplied to the input of the first stage of amplification, 101a, and then routed from 101a to second stage 101b, and so on, until the RF signal has passed through the last amplification stage (which is stage 101f on FIG. 1). Due to the placement of the stages in relation to each other, the RF signal flow appears as a zig-zag or S-shaped winding pattern through the amplifier. In this manner, the present embodiment configures adjacent stages in a "stacked" configuration, and the input of one stage is in close proximity to the output of the next stage. It should be appreciated that various other configurations may also be used to cause a similar zig-zag signal flow.

MMIC driver amplifier 100 of the invention further includes DC bias circuitry 104 and 106, the structure and operation of which are well known and therefore will not be discussed herein. The configuration of the amplification stages of the invention allows the bias circuitry to be located in an organized manner away from the stages. For example, bias circuitry 104, 106 may be suitably located on the perimeter of the chip with transmission lines leading to the stages. The placement of the DC components and circuitry in relation to the RF components, as well as on the chip, may offer several advantages such as, DC and RF signal separation, bias may be easily supplied to the perimeter of the chip, and the grouping of DC components may minimize the number of needed components and circuitry.

Leading from bias circuitry 104 and 106 are trace lines to each of the amplification stages. Each stage receives gate bias and drain bias (or the equivalent if FETs are not used) from gate bias circuitry 104 and drain bias circuitry 106, respectively. The present embodiment includes six stages, 101a–101f and, therefore, includes a gate bias feed 106a–106f and drain bias feed 104a–104f for each stage. Additionally, a capacitor 108a–108e is placed between each of the stages to, among other reasons, provide DC blocking.

As already mentioned, on-chip placement of the RF and DC components in accordance with the invention, helps to reduce the overall size of the chip. Additionally, the interstage matching network of the invention helps to further reduce the number of needed components and reduce the size of the chip. With continued reference to FIG. 1, a three element matching network (shunt L-series C-shunt L) permits impedance matching between the stages without requiring additional elements. For example, drain bias feed 104a may be suitably tuned to be a shunt RF tuning element (i.e., shunt L), capacitance 108a may be tuned to be a series capacitance (i.e., series C), and gate bias feed 106b may be tuned to be a shunt RF tuning element (i.e., shunt L). In this manner, adjustment to the "already in place" components and/or transmission lines enables interstage matching without sacrificing valuable chip space or amplifier performance. Those of skill in the industry are generally familiar with the various techniques for signal matching (e.g., determining specific component values and the computation involved) and, therefore these techniques will not be discussed herein.

Figure 2:
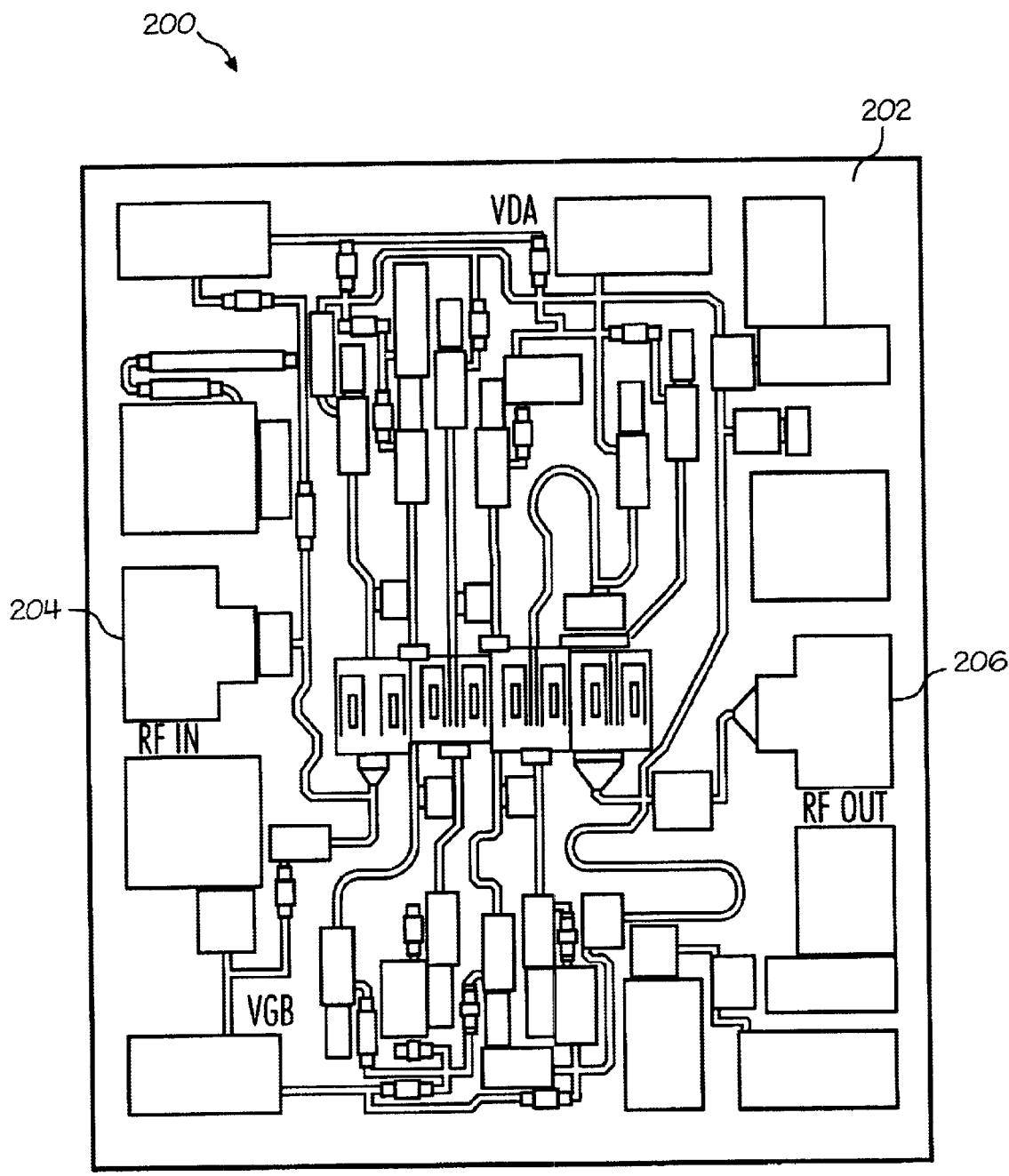
FIGS. 2 and 3 illustrate MMIC driver amplifier layouts in accordance with various embodiments of the invention.

Referring now to FIG. 2, a MMIC layout of a driver amplifier 200 in accordance with one embodiment of the invention is illustrated. An RF signal at an input port 204 of driver amplifier 200 is amplified by the multiple FET stages. The output of the final amplification stage is provided at an output port 206. The chip topology of the invention can be seen in the present embodiment, such as the stacked stage configuration and the centralized DC bias circuitry.

Driver amplifier 200 may be fabricated on any suitable MMIC substrate (i.e., chip, die) 202 of a suitable semiconductor material such as silicon (Si), gallium arsenide (GaAs), germanium (Ge), indium phosphide (InP), and combinations such as mixed silicon and germanium, mixed silicon and carbon, and the like.

As previously stated, the topology of the invention reduces the overall size of the MMIC. Exemplary driver amplifier 200 may include, for example, a six stage Ka-band frequency MMIC amplifier having a gain of about 30 dB and is approximately 1.5 mm² (1.15 mm×1.3 mm). In contrast, a conventional three stage 30 GHz MMIC amplifier having a gain of about 16–18 dB requires a die size of approximately 3.42 mm² (2.85 mm×1.2 mm). Thus, the MMIC amplifier in accordance with the systems and methods of the invention has about a 56% reduced size over the conventional MMIC amplifier while increasing the number of amplification stages and the gain.

It should be appreciated that the number of amplification stages and/or number of FET fingers in each stage can vary depending upon the power needs of the particular application. As shown, exemplary driver amplifier 200 includes six stages with each FET having two fingers, except the last FET having four fingers.

Additional features of the present embodiment and in accordance with the invention include sharing vias between some or all of the stages. For example, due in part to the stacked configuration of the stages as previously described, the source vias of each stage may be combined. One skilled in the industry can readily recognize that by combining vias, the number of needed vias can be reduced. Hence, using the topology of the invention, the number of vias may be reduced by about 50%, helping to reduce the overall chip size and to maintain the chip integrity.

The reduced die size of the invention provides easier handling and assembly of the die. Additionally, smaller die area decreases the probability of random die defects within the die itself and reduces the chance of solder voids in the attach process. Moreover, the topology of the invention (e.g., stacked stages and centralized DC circuitry) lends itself to a substantially square chip which helps to improve yields by reducing stress points. The relatively thin 2-mil die (i.e., 50 $\mu$m) is extremely susceptible to breakage, and as the die area increases, the chance of breakage increases. One skilled in the art will readily recognize the benefits of the reduced die size provided by the invention including, but not limited to, the improved production yield when using a thin die. Some of the advantages of the invention are herein described with respect to a 2-mil die, for among the same and other reasons, it should be appreciated that the present invention is equally as advantageous for other die sizes (e.g., 1-mil, 4-mil, 8-mil, and the like).

Figure 3:
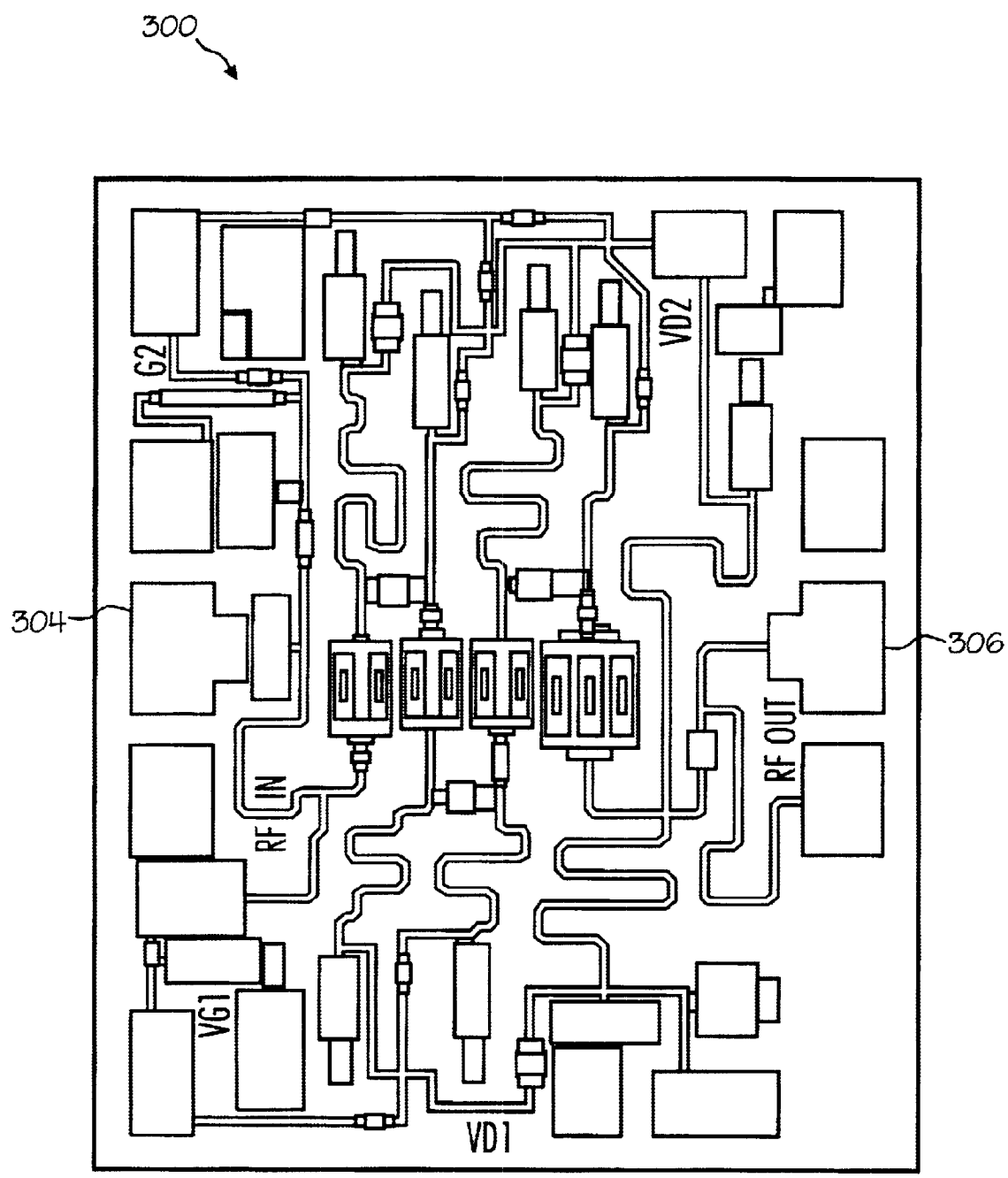

FIG. 3 illustrates a MMIC driver amplifier 300 layout in accordance with another embodiment of the invention. An RF signal at an input port 304 of driver amplifier 300 is amplified by the multiple FET stages, with the output of the final amplification stage provided at an output port 306. Driver amplifier 300 includes a similar topology as the previous embodiments (i.e., stacked stage configuration, zigzag RF signal flow, and centralized DC components), except that driver amplifier 300 is a four stage, 30 dB gain, Ku-band frequency MMIC amplifier. In this embodiment, vias may not be shared because the number of stages has been decreased. However, it should be realized that the in another embodiment the vias of adjacent stages may be shared.

It should be appreciated that the particular implementations shown and described herein are illustrative of various embodiments of the invention including its best mode, and are not intended to limit the scope of the present invention in any way. For example, the systems and methods for MMIC driver amplifiers described herein were described with respect to FETs, however various other active devices may be equally as suitable. For the sake of brevity, conventional techniques for signal processing, data transmission, signaling, and network control, and other functional aspects of the systems (and components of the individual operating components of the systems) may not be described in detail herein. Furthermore, the connecting lines shown in the various figures contained herein are intended to represent exemplary functional relationships and/or physical couplings between the various elements. It should be noted that many alternative or additional functional relationships or physical connections may be present in a practical communication system.

While the principles of the invention have now been made clear in illustrative embodiments, there will be immediately obvious to those skilled in the art many modifications of structure, arrangements, proportions, the elements, materials and components, used in the practice of the invention which are particularly adapted for a specific environment and operating requirements without departing from those principles. These and other changes or modifications are intended to be included within the scope of the present invention, as expressed in the following claims.

What is claimed is:

1. A driver amplifier comprising a plurality of amplification stages with each stage having an RF signal input and an RF signal output, the stages being arranged in a stacked configuration such that adjacent stages are orientated in opposite directions so that the output of one stage is in close proximity to the input of an adjacent stage to permit substantially of an RF signal received at said RF signal output to flow in a zig-zag pattern through all the stages.

2. A driver amplifier comprising:
a plurality of amplification stages arranged on a die to permit substantially all of an RF signal to flow from one stage to the next stage and said RF signal flow being characteristic of a zig-zag pattern; and
a DC bias circuitry centralized on said die, said circuitry providing a bias feed to each of said amplification stages.

3. The driver amplifier of claim 2, wherein said stages being arranged on said die such that adjacent stages are orientated in opposite directions.

4. The driver amplifier of claim 2, wherein said stages being arranged on said die such that an output of one stage is in close proximity to an input of an adjacent stage.

5. The driver amplifier of claim 2, wherein said DC bias circuitry centralized on a perimeter of said die.

6. The driver amplifier of claim 2, wherein said die comprises a 2-mil die.

7. A MMIC driver amplifier comprising:
a plurality of FET amplification stages with each stage having an RF signal input and an RF signal output, the stages being arranged on a die such that adjacent stages are orientated in opposite directions so that the output of one stage is in close proximity to the input of an adjacent stage to permit an RF signal flow through all the stages characteristic of a zig-zag pattern;
a DC bias circuitry centralized on said die, said circuitry providing a bias feed to each of said amplification stages; and
an interstage matching network comprising said bias feed and a DC blocking capacitor.

8. The MMIC driver amplifier of claim 7, configured to operate in a K band frequencies.

9. The MMIC driver amplifier of claim 7, configured to operate in a Ka band frequencies.

10. The MMIC driver amplifier of claim 7, configured to operate in a Ku band frequencies.

11. The MMIC driver amplifier of claim 7, wherein said DC bias circuitry being centralized on a perimeter of said die.

12. The MMIC driver amplifier of claim 7, wherein at least two of said stages being arranged to share a source via.

13. A method of driver amplification comprising:
arranging a plurality of amplification stages on a die to permit substantially all of an RF signal to flow through all the stages in a zig-zag manner; and
supplying a DC bias to each of said amplification stages from a centralized DC bias circuitry on a perimeter of said die.

14. The method of driver amplification of claim 13, wherein said arranging comprising orientating adjacent stages in opposite directions.

15. The method of driver amplification of claim 13, wherein said arranging comprising orientating adjacent stages so that an output of one stage is in close proximity to an input of an adjacent stage.

16. The method of driver amplification of claim 13, further comprising sharing source vias with at least two of said stages.

17. The method of driver amplification of claim 13, further comprising signal matching said stages by adjusting a DC bias feed and adjusting a capacitor to each of said stages.

18. A method of manufacturing a MMIC driver amplifier comprising:
arranging a plurality of amplification stages on a die such that an RF signal flows through the stages in a substantially zig-zag pattern;
arranging a DC bias circuitry on a perimeter of said die;
routing a transmission line between said DC bias circuitry and each of said stages; and
modifying said transmission line to provide signal matching between said stages.

19. A driver amplifier comprising:
a plurality of amplification stages arranged on a die to permit an RF signal flow from one stage to the next stage and said signal flow being characteristic of a zig-zag pattern, wherein at least two of said stages being arranged to share a source via; and
a DC bias circuitry centralized on said die, said circuitry providing a bias feed to each of said amplification stages.

20. A driver amplifier comprising:
a plurality of amplification stages arranged on a die to permit an RF signal flow from one stage to the next stage and said signal flow being characteristic of a zig-zag pattern;
a DC bias circuitry centralized on said die, said circuitry providing a bias feed to each of said amplification stages; and
an interstage matching network comprising said DC bias feed and a DC blocking capacitor.

* * * * *